(12) United States Patent
Vlasenko et al.

(10) Patent No.: US 7,336,752 B2
(45) Date of Patent: Feb. 26, 2008

(54) WIDE FREQUENCY RANGE DELAY LOCKED LOOP

(75) Inventors: Peter Vlasenko, Ottawa (CA); Dieter Haerle, Ottawa (CA)

(73) Assignee: MOSAID Technologies Inc., Kanata, Ontario (CA)

( * ) Notice: Subject to any disclaimer, the term of this patent is extended or adjusted under 35 U.S.C. 154(b) by 720 days.

(21) Appl. No.: 10/335,535

(22) Filed: Dec. 31, 2002

(65) Prior Publication Data

US 2004/0125905 A1 Jul. 1, 2004

(51) Int. Cl.
*H03D 3/24* (2006.01)

(52) U.S. Cl. .................. 375/376; 375/371; 375/373; 375/375; 327/147; 327/150; 327/153; 327/156; 327/158; 327/159

(58) Field of Classification Search ........ 375/371–376; 327/147–158
See application file for complete search history.

(56) References Cited

U.S. PATENT DOCUMENTS

| 5,544,203 | A | 8/1996 | Casasanta et al. | |
| 5,604,775 | A | 2/1997 | Saitoh et al. | |
| 6,087,868 | A | 7/2000 | Millar | |
| 6,327,318 | B1 | 12/2001 | Bhullar et al. | |
| 6,333,896 | B1 | 12/2001 | Lee | |
| 6,377,092 | B2 | 4/2002 | Ikeda | |
| 6,392,456 | B1 | 5/2002 | Pyeon et al. | |
| 6,489,823 | B2 * | 12/2002 | Iwamoto | 327/158 |
| 6,518,807 | B1 * | 2/2003 | Cho | 327/158 |
| 6,765,976 | B1 * | 7/2004 | Oh | 375/376 |
| 2002/0008558 | A1 * | 1/2002 | Okuda et al. | 327/175 |

FOREIGN PATENT DOCUMENTS

EP 1282229 5/2003

OTHER PUBLICATIONS

Sidiropoulos, S., et al., "A Semidigital Dual Delay-Locked Loop", *IEE Journal of Solid-State Circuits*, vol. 32, No. 11, Nov. 1997, pp. 1683-1692.

Dehng, G., et al., "A Fast-Lock Mixed-Mode DLL Using a 2-b SAR Algorithm," *IEEE Journal of Solid-State Circuits*, 36(10):1464-1471 (Oct. 2001).

(Continued)

*Primary Examiner*—Curtis Odom
(74) *Attorney, Agent, or Firm*—Hamilton, Brook, Smith & Reynolds, P.C.

(57) ABSTRACT

A delay locked loop operates over a wide range of frequencies and has high accuracy, small silicon area usage, low power consumption and a short lock time. The DLL combines an analog domain and a digital domain. The digital domain is responsible for initial lock and operational point stability and is frozen after the lock is reached. The analog domain is responsible for normal operation after lock is reached and provides high accuracy using smaller silicon area and low power.

17 Claims, 10 Drawing Sheets

OTHER PUBLICATIONS

Garlepp, B. W., et al., "A Portable Digital DLL of High-Speed CMOS Interface Circuits," *IEEE Journal of Solid-State Circuits*, 34(5):632-644 (May 1999).

Jung, Y. et al., "A Dual-Loop Delay-Locked Loop Using Multiple Voltage-Controlled Delay Lines," *IEEE Journal of Solid-State Circuits*, 36(5):784-791 (May 2001).

Maneatis, J. G., "Low-Jitter Process-Independent DLL and PLL Based on Self-Biased Techniques," *IEEE Journal of Sold-State Circuits*, 31(11):1723-1732 (Nov. 1996).

Moon, Y., et al., "An All-Analog Multiphase Delay-Locked Loop Using A Replica Delay Line for Wide-Range Operation and Low-Jitter Performance," *IEEE Journal of Solid-State Circuits*, 35(3):377-384 (Mar. 2000).

Sidiropoulos, S. and Horowitz, M. A., "A Semidigital Dual Delay-Locked Loop," *IEEE Journal of Solid-State Circuits*, 32(11):1683-1692 (Nov. 1997).

* cited by examiner

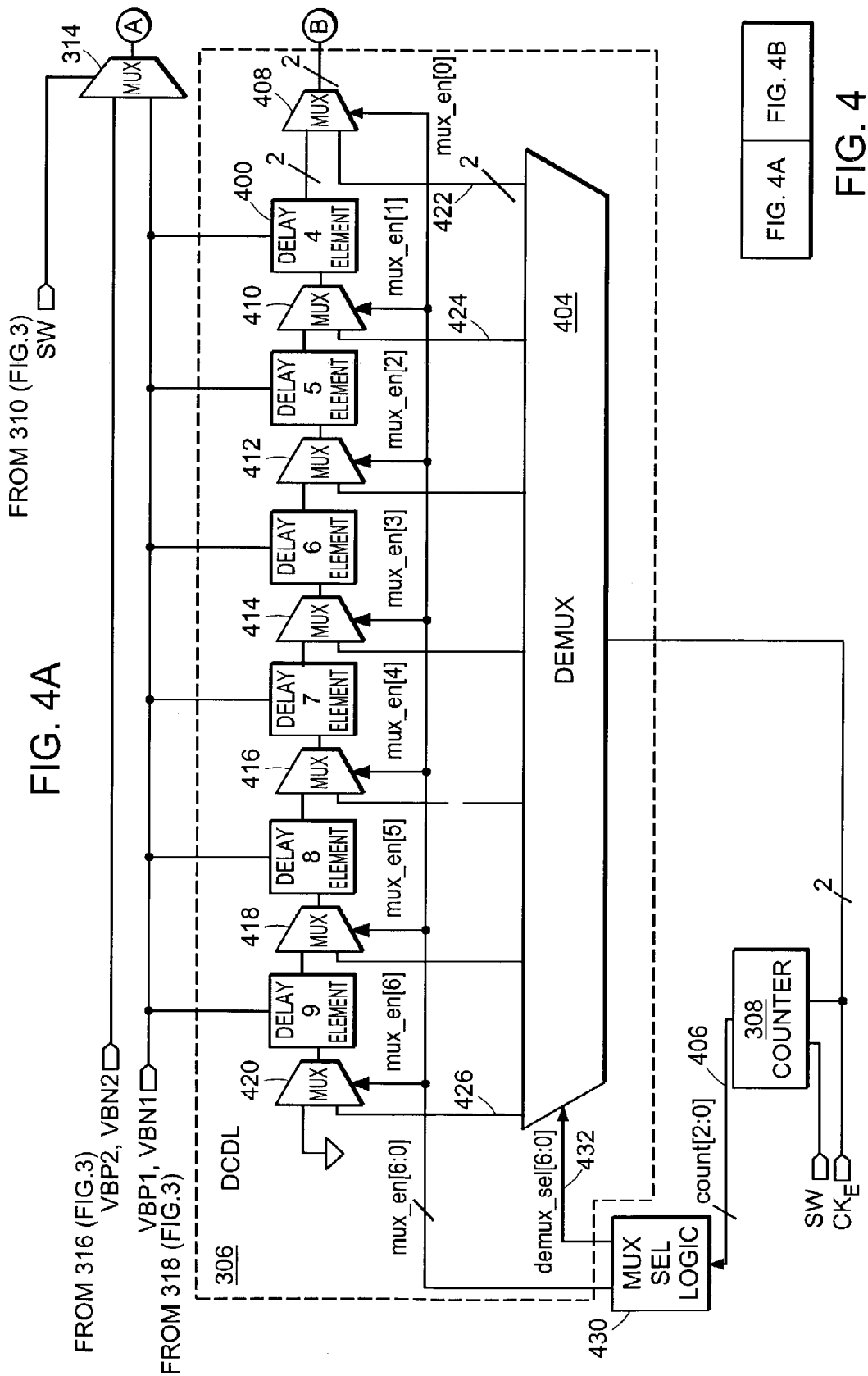

WIDE FREQUENCY RANGE DELAY LOCKED LOOP

BACKGROUND OF THE INVENTION

Many devices such as synchronous dynamic random access memory (SDRAM) and microprocessors receive an external clock signal generated by an external clock source such as a crystal oscillator. The external clock signal received through an input pad on the device is routed to various circuits within the device through a tree of buffer circuits. The buffer tree introduces a common delay between the external clock and each buffered clock.

Typically, a delay locked loop (DLL) with an adjustable delay line is used to synchronize the buffered clock signal with the external clock signal by delaying the external clock signal applied to the buffer tree. The DLL includes a phase detector, which detects the phase difference between the external clock signal and a buffered clock signal. Based on the detected phase difference, the DLL synchronizes the buffered clock signal to the external clock signal by adding an appropriate delay to the external clock signal until the buffered external clock signal (the internal clock) is in phase with the external clock signal. The DLL can be implemented as an analog delay locked loop or a digital delay locked loop. In an analog delay locked loop, a voltage controlled delay line is used to delay the external clock signal.

FIG. 1 is a block diagram of a prior art analog delay locked loop (DLL) 100. The analog DLL 100 synchronizes an internal clock signal CKI with an external clock signal CKE. The external clock CKE signal is coupled to a voltage controlled delay line 102, and the voltage controlled delay line 102 is coupled to clock tree buffers 108. The delayed external clock signal CKE is fed into the clock tree buffers 108 where it propagates to the outputs of the tree and is applied to the various circuits. The delay through the clock tree buffer 108 results in a phase difference between the external clock signal CKE and the internal clock signal CKI. The voltage controlled delay line 102 adjusts the delay of the external clock signal CKE by either increasing or decreasing the delay, to synchronize the external and internal clock signals.

To determine the appropriate delay in the delay line, one of the outputs of the clock tree buffers 108 is coupled to a phase detector 104 where it is compared with the external clock signal CKE. The phase detector 104 detects the phase difference between the internal clock CKI and the external clock CKE. The output of the phase detector 104 is integrated by a charge pump 106 and a loop filter capacitor 112 to provide a variable bias voltage VCTRL 110 for the voltage controlled delay line (VCDL) 102. The bias voltage VCTRL selects the amount of delay to be added to the external clock signal by the VCDL 102 to synchronize the internal clock signal CKI with the external clock signal CKE.

The phase detector 104 is a D-type flip-flop with the D-input coupled to the external clock signal CKE and the clock input coupled to the internal clock signal CKI. On each rising edge of the internal clock signal CKI, the output of the phase detector 104 indicates whether the rising edge of the internal clock signal is before or after the rising edge of the external clock signal.

The analog DLL 100 produces a voltage controlled delay with high accuracy. However, performance of the analog DLL varies over a frequency range because the delay generated using the voltage controlled delay line varies non-linearly with changes in the bias control voltage VCTRL.

FIG. 2 is a graph illustrating the non-linear control voltage characteristic for the voltage controlled delay line shown in FIG. 1. In general, devices support a wide range of external clock frequencies within which an operational frequency is selected for a particular device. In the example shown in FIG. 2, the device can operate at any frequency between point A and point C. The operational frequency selected is at point B.

As shown, the control voltage characteristic is non-linear: sharp at one end of the control voltage range (point C) and almost flat at the opposite end (point A). This control voltage characteristic results in DLL instability at point C and long lock times at point A. The wide range of frequencies (delays) is controlled by the bias voltage VCTRL.

Referring again to FIG. 1, the bias voltage VCTRL is the output of the charge pump 106, which remains in a high-impedance state most of the time. Any noise on the bias voltage signal VCTRL disturbs the output of the analog DLL 100. For example, if the analog DLL is operating at point B, a small voltage change ($\Delta V$) due to noise results in a large change in delay. Thus, the analog DLL is very sensitive to noise when operating at point B, within the wide frequency range shown from point C to point A. Therefore, the analog DLL is not stable within a wide frequency range.

A digital DLL does not have the stability problem of an analog DLL. However, the accuracy of a digital DLL is as high as the accuracy of an analog DLL, because the delay is provided by combining fixed quantum (steps) of delay. The smaller the step of delay, the higher the accuracy. However, a decrease in step size results in a corresponding increase in silicon area because more delay elements are required to cover the wide frequency range.

SUMMARY OF THE INVENTION

A delay locked loop, which has high accuracy, good stability and a fast lock time over a wide frequency range is presented. The delay locked loop combines shorter lock time, good accuracy and stability with low power consumption and small silicon area for the delay locked loop operating in a wide range of frequencies.

The delay locked loop includes a digital delay circuit and an analog delay circuit. The digital delay circuit enables delay elements to provide coarse phase adjustment in the delay locked loop. The analog delay circuit provides a fine phase adjustment in the delay locked loop while the digital delay circuit is held at a fixed delay. A lock detector in the digital delay circuit detects completion of the coarse phase adjustment, freezes the fixed delay upon completion and enables fine phase adjustment.

The digital delay circuit, which includes a plurality of fixed delay elements, operates over a wide delay range. The analog delay circuit operates over a small delay range within the wide delay range and is held at a second fixed delay until the digital delay circuit completes the coarse phase adjustment.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

A description of preferred embodiments of the invention follows.

Figure 3:
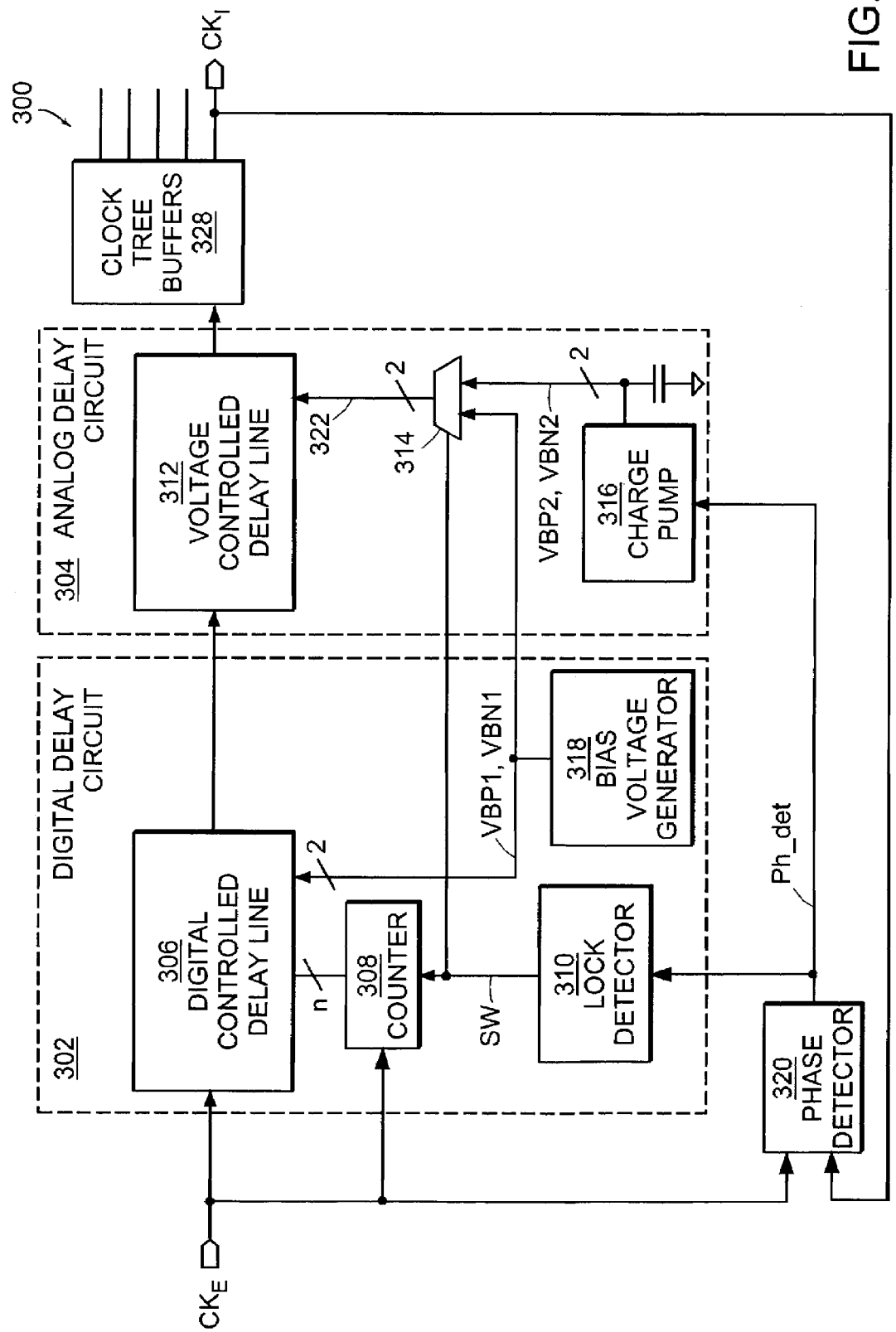
FIG. 3 is a block diagram of a wide frequency range delay locked loop according to the principles of the present invention.

FIG. 3 is a block diagram of a wide frequency range delay locked loop (DLL) 300 according to the principles of the present invention. The wide frequency range DLL 300 has two domains of operation: a digital domain which includes a digital delay circuit 302 and an analog domain which includes an analog delay circuit 304.

In a DLL, high accuracy, small silicon area usage and lower power are typically achieved using an analog technique, while good stability and shorter lock times are typically achieved with a digital technique. The wide frequency range DLL 300 combines the two techniques to provide high accuracy, good stability and a fast lock time over a wide frequency range. The digital delay circuit 302 is responsible for coarse phase adjustment during initialization and the analog delay circuit 304 is responsible for fine phase adjustment during normal operation, after coarse phase adjustment is completed by the digital delay circuit 302. The digital delay circuit 302 operates within the wide delay range and brings the delay locked loop 300 to a stable operation point during power-up initialization. In normal operation, the analog delay circuit 304 operates within a small delay range of the stable operation point within the wide delay range and maintains the delay locked loop at the stable operation point while the digital delay circuit 302 is held at a fixed delay.

The overall delay provided by the DLL includes a digitally controlled delay line (DCDL) 306 having a set of delay elements, each having a fixed delay and a voltage controlled delay line (VCDL) 312. The combination of the DCDL delay provided by the DCDL 306 and the VCDL delay provided by the VCDL 312 provides an accurate delay. Only one of the domains can vary the DLL delay at any time. At power-up initialization, the digital delay circuit 302 varies the DCDL 306 (coarse delay). After coarse phase adjustment is complete (lock is reached), the DCDL delay is held at a fixed number of DCDL delay elements (frozen) and the analog delay circuit 304 varies the DLL delay to provide fine phase adjustment by varying the VCDL delay.

The digital delay circuit 302 operates within the wide delay range to bring the DLL 300 to the operation point (lock) quickly to provide a short lock time. A lock detector 310 in the digital delay circuit 302 detects when the digital delay circuit 302 has brought the DLL delay to the stable operation point and enables control of the DLL delay to be switched to the analog delay circuit 304.

A phase detector 320 detects the phase difference between the external clock signal CKE and the internal clock signal CKI. The phase detector 320, can be any phase detector well known to those skilled in the art. In the embodiment shown, the phase detector 320 (FIG. 3) includes a D-type flip-flop with CKI connected to the clock input and CKE connected to the D-input. The rising edge of CKI latches the state of CKE at the output (Ph_det) of the D-type flip-flop.

The analog delay circuit 304 includes a multiplexor 314, a VCDL 312 and a charge pump 316. The VCDL 312 is a chain of differential-input-differential-output stages (delay elements) each controlled by two bias voltages VBP, VBN which can be provided by two different sources under control of the multiplexor 314 as will be described in further detail later. In FIG. 3, a single signal is used to designate the two bias voltages from each source, i.e. VBP2, VBN2 and VBP1, VBN1.

The multiplexor 314 selects the source of the VCDL bias voltages 322 to the VCDL 312. The VCDL bias voltages 322 can be either of bias voltage pair VBP1, VBN1 provided by bias voltage generator 318 or a variable bias voltage pair VBP2, VBN2 provided by charge pump 316. During initialization, before the DCDL 306 achieves lock, the differential bias voltage VBP1, VBN1 pair is provided to the VCDL bias voltage 322 through multiplexor 314. Thus, while the digital delay circuit 302 selects the DCDL delay, the VCDL bias voltage 322 provides a constant VCDL delay. That delay may be in the middle of the full delay range of the VCDL to enable fine tuning in both positive and negative directions as discussed below.

At initialization, the code stored in a counter 308 is initialized to zero, which corresponds to the minimum delay; that is, the minimum number of delay elements in the DCDL 306 that are enabled. The lock detector 310 allows the DCDL 306 to increase the DCDL delay by adding delay elements as the counter 318 is incremented until the nearest rising edge of the internal clock signal CKI is aligned with the rising edge of the external clock signal CKE. The counter 308 is incremented by the external clock signal CKE until lock is reached (the clocks edges are aligned). In one embodiment, the counter 308 is an up-counter which increments on each rising edge of the external clock signal CKE while enabled by the SW signal from the lock detector 310. Delay elements in the DCDL 306 are added to the DCDL delay line based on the c-bit count value output by the counter 308 to enable the minimum number of DCDL delay elements necessary dependent on the bias voltage pair VBP1, VBN1.

After the clocks edges are aligned, the SW signal output by the lock detector 310 disables any further incrementing of the counter 308. The VCDL bias voltage 322 is provided by bias voltage pair VBP2, VBN2, the output of charge pump 316, through multiplexor 314. The charge pump 316 can be any charge pump well known to those skilled in the art.

By enabling only the minimum number of delay elements in the DCDL 306, the overall delay line is minimum length to minimize noise. The enabled delay elements provide coarse phase adjustment in the delay locked loop. Once lock is reached, the digital delay circuit 302 is held at a fixed delay by disabling further incrementing of the counter 308. Only the VCDL portion of the DLL delay line can be varied by the analog delay circuit 304 to provide fine phase adjustment in the delay locked loop. The analog delay circuit 304 fine tunes the DLL delay to compensate for all drifts and condition changes during normal operation of the DLL, to keep the external and internal clock signal edges aligned, by varying the VCDL delay, which is added to the fixed delay provided by the DCDL. The analog controlled delay line 310 varies the VCDL delay up or down by varying the bias voltage to the VCDL delay elements 402 based on detected phase difference between the clocks.

Figure 4B:
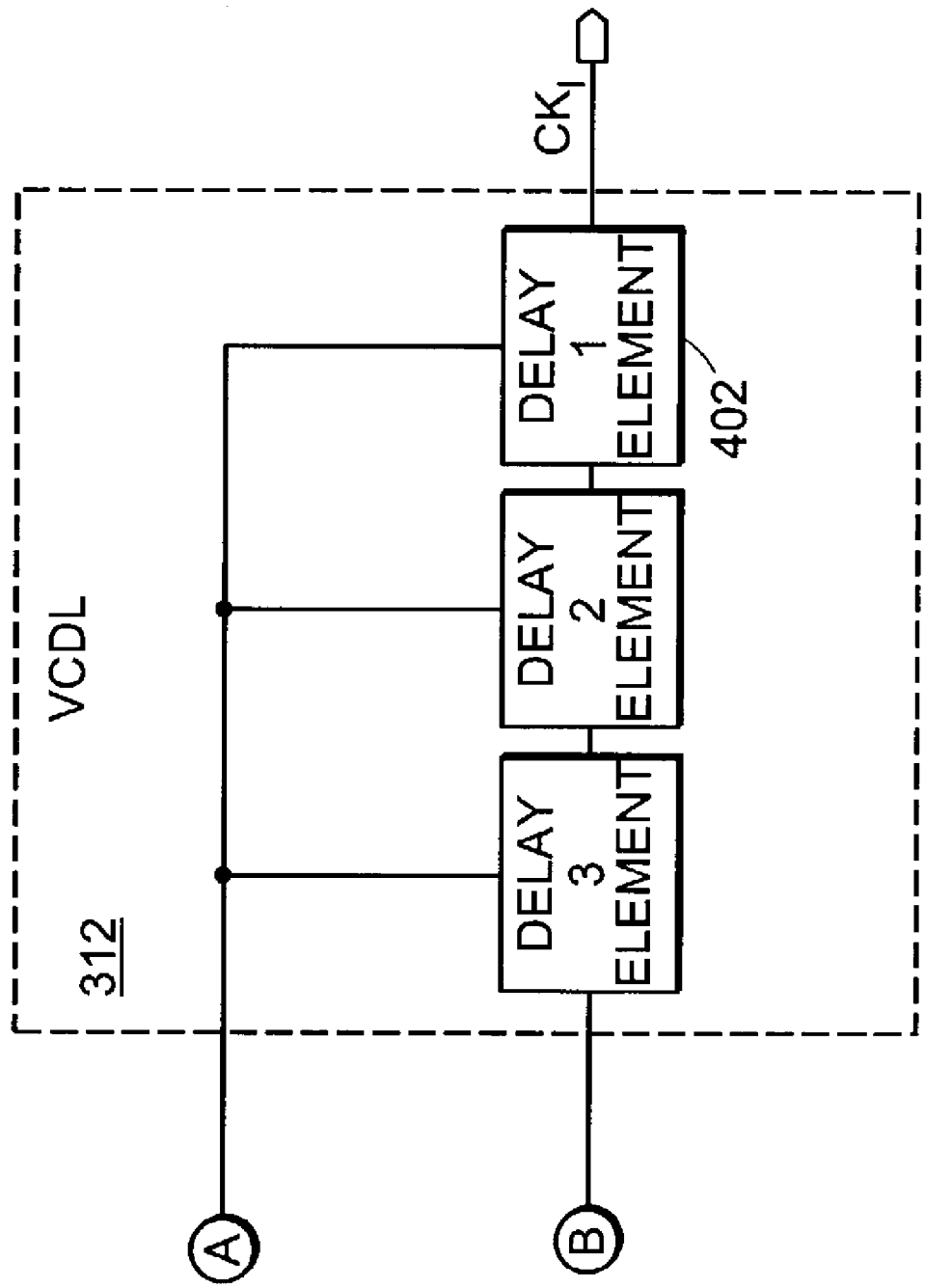
FIG. 4 illustrates delay elements in the DCDL and the VCDL.

FIG. 4 illustrates in further detail delay elements in the DCDL and the VCDL. The digitally controlled delay line (DCDL) includes a chain of DCDL delay elements 400 and the voltage controlled delay line (VCDL) includes a chain of VCDL delay elements 402. The delay of each DCDL cell 400 is fixed by permanently connecting the bias voltage for each DCDL cell 400 to a fixed bias voltage pair VBP1, VBN1. The fixed bias voltage pair VBP1, VBN1 is provided by a bias voltage generator 318 (FIG. 3) which can be any type of voltage stabilizing device, for example, a band-gap reference and need not correspond to the VCDL bias voltage 322 initially applied to the VCDL as will be discussed in further detail below.

Figure 5:
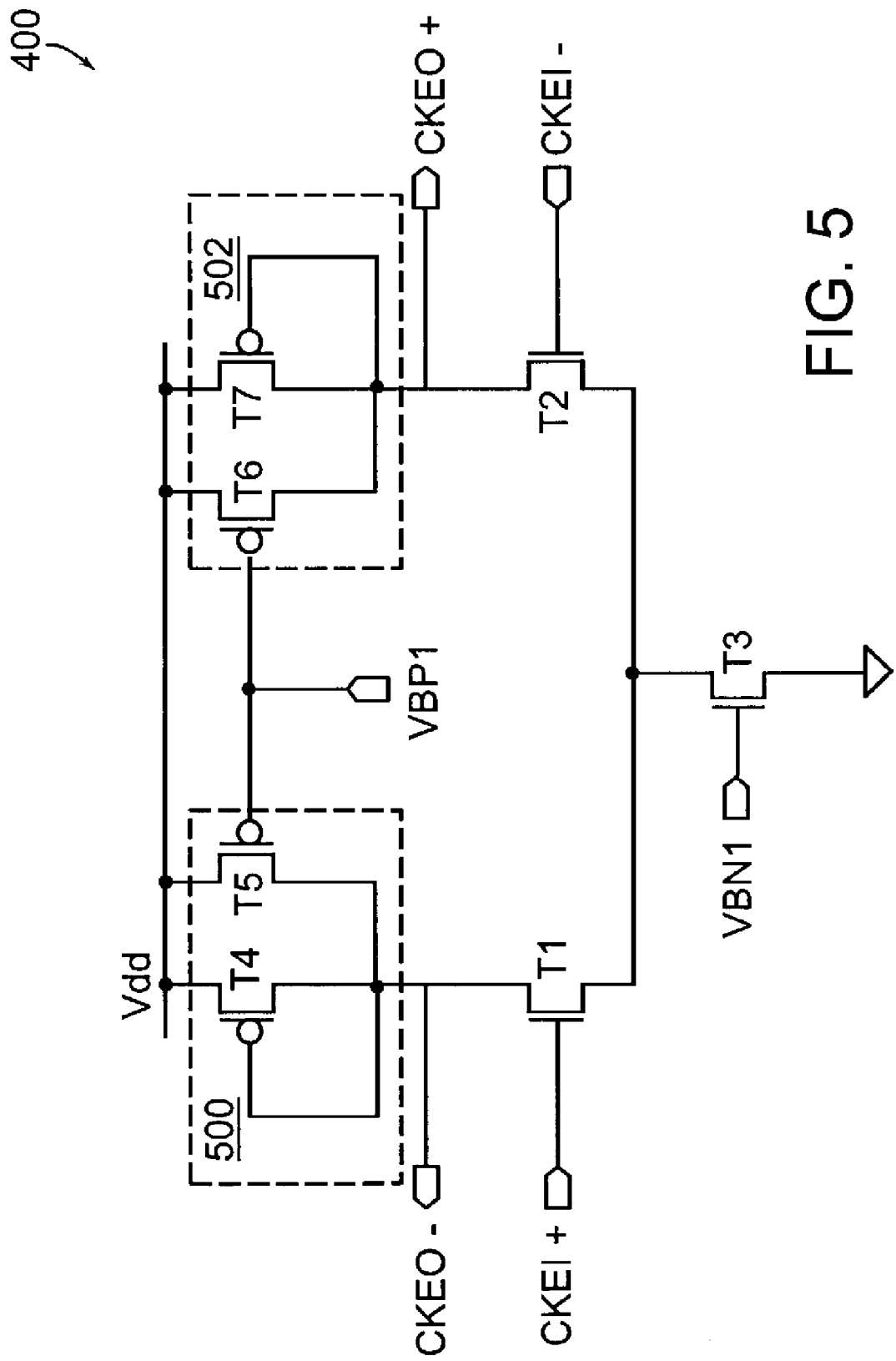
FIG. 5 is a schematic of one embodiment of any one of the delay elements shown in FIG. 4.

FIG. 5 is a schematic of one embodiment of any one of the delay elements shown in FIG. 4. The delay element 400 includes a source-coupled pair of NMOS devices T1, T2 with symmetric loads 500, 502.

The differential input clock signal CKEI−, CKEI+, is coupled to the respective gates of NMOS devices T1, T2 with CKEI+ coupled to the gate of NMOS device T1 and CKEI− coupled to the gate of NMOS device T2. The differential output clock signal CKEO−, CKEO+, is coupled to the respective drains of NMOS devices T1, T2. The sources of NMOS devices T1 and T2 are coupled and are also coupled to the drain of NMOS current source T3. NMOS current source T3 compensates for drain and substrate voltage variations.

Symmetric load 500 includes a diode-connected PMOS device T4 connected in parallel with a biased PMOS device T5. Symmetric load 502 includes a diode-connected PMOS device T7 connected in parallel with a biased PMOS device T6. The effective resistance of the symmetric loads 500, 502 changes with changes in the bias voltage VBP1 resulting in a corresponding change in delay through the delay stage from the differential clock input to the differential clock output.

Returning to FIG. 4, at initialization, none of the delay elements 400 in the DCDL 306 are enabled, since the c-bit count value output from the counter is 0 and only multiplexor 408 is enabled. The DLL delay includes only the fixed delay provided by demultiplexor 404, multiplexor 408 and the VCDL delay elements 402 in the VCDL connected to the fixed bias voltage pair VBP1, VBN1. The VCDL delay provided by VCDL is dependent on the fixed bias voltage pair VBP1, VBN1. In the embodiment shown in FIG. 4, the DCDL delay elements 400 and the VCDL delay elements 402 are the same delay element with voltage controlled delay. However, in an alternate embodiment, the DCDL delay element 400 can differ from the VCDL delay element 402, which is described and illustrated in FIG. 5.

The DCDL delay is varied by increasing the number of DCDL delay elements 400 with each DCDL delay element 400 having the same delay set by the fixed bias voltage pair VBP1, VBN1. In the embodiment shown, during initialization the same fixed bias voltage pair VBP1, VBN1 is coupled to the DCDL delay elements 400 and the VCDL elements 402. However, in alternate embodiments, the fixed bias voltage coupled to the VCDL delay elements 402 and the DCDL delay elements 400 can be different; for example, a first bias voltage VBP1 may be set to 0.3VDD coupled to the DCDL and a second bias voltage VBP2 may be set to 0.5VDD coupled to the VCDL. The VCDL delay is initially fixed with each of the three VCDL delay elements 402 numbered 1-3 coupled to the fixed bias voltage pair VBP1, VBN1, but the VCDL delay varies with changes in the VCDL bias voltage pair 322 VBP2, VBN2 during normal operation.

The number of delay elements enabled in the DCDL 306 is dependent on the c-bit count 406 output by the counter 308. The c-bit count 406 is coupled to multiplexor select logic 430 which provides an m-bit multiplexor select signal, with one of each of the m-bits coupled to each multiplexor in the DCDL 306 and a d-bit de-multiplexor select signal 432 coupled to the de-multiplexor 404. The d-bit de-multiplexor select signal 406 is coupled to the de-multiplexor 404 to select the output of the de-multiplexor 404 through which the external clock is output to the DCDL 306. In one embodiment the multiplexor select logic 430 is a decoder which decodes the c-bit count to provide the m-bit multiplexor select signal. In the embodiment shown m and d are both 7 and c is 3. However, in an alternate embodiment m and d can be different. There are six delay elements 400 labeled 4-9. The multiplexor select logic 430 decodes a three bit count 406 to select one of the seven multiplexors through which to provide the external clock to the respective delay element as shown in Table 1 below. The Most Significant Bit (MSB) of the seven bit multiplexor select signal corresponds to the select signal for multiplexor 420 and the Least Significant Bit (LSB) of the seven bit multiplexor signal corresponds to the select signal for multiplexor 408. Thus, as the count increases the number of delay elements enabled increases. In an alternate embodiment, the multiplexor select logic can be implemented as a shift register clocked by the external clock and enabled by the SW signal.

TABLE 1

| Counter output count[2:0] | Multiplexor select mux_en[6:0] | De-multiplexor select demux_sel[6:0] |
| --- | --- | --- |
| 000 | 1111110 | 1111110 |
| 001 | 1111101 | 1111101 |
| 010 | 1111011 | 1111011 |
| 011 | 1110111 | 1110111 |
| 100 | 1101111 | 1101111 |
| 101 | 1011111 | 1011111 |
| 110 | 0111111 | 0111111 |

After lock has been reached, the external clock signal CKE is delayed through DCDL delay elements enabled dependent on the c-bit count output by counter 308. Control of the DLL delay is switched to the VCDL 312 by switching the bias voltage provided to the VCDL from the bias voltage pair VBP1, VBN1 to the bias voltage pair VBP2, VBN2 through the multiplexor 314 (FIG. 3).

Thus, the DLL delay includes minimum delay provided by the enabled DCDL delay elements 400 in the DCDL 306 and additional delay provided by the VCDL 312 to provide an accurate DLL delay. The stability of the DLL is increased by using the digital domain to cover a wide delay range to obtain a minimum delay, then freezing the digital domain to allow the analog domain to operate within a small delay range to provide fine phase adjustment in the delay locked loop by controlling the DLL delay. The bias voltage coupled to the VCDL bias voltage 322 is set so that the VCDL does not control the overall DLL delay until after a locked condition is detected by the digital domain. Before locked condition, the VCDL merely provides a constant delay independent of the phase difference between the clocks.

In one embodiment, the counter 308 is implemented as a ripple counter. Initially the counter 308 is reset to 0. The de-multiplexor 404 steers the external clock CKE to delay elements dependent on the d-bit de-multiplexor select signal 432 output by the multiplexor select logic 430. With the output of the counter 308 set to '0' and the de-multiplexor select signal 432 set to '1111110', CKE is steered through output 422 of de-multiplexor 404 coupled to multiplexor 408 and no delay DCDL elements 400 are enabled.

After the output of the counter 308 is incremented from 000 to 001 as shown in Table 1 by CKE, the clock signal CKE is steered through the output 424 of the de-multiplexor 404 by the counter output set to '1' to enable DCDL delay stage labeled 4. Multiplexor 410 is enabled to allow CKE to be steered through to DCDL delay stage 400 as the m-bit multiplexor select signal output by multiplexor select logic 430 steers delayed CKE through multiplexor 408 to the VCDL. It will be understood by one skilled in the art, that the embodiment of the de-multiplexor 404 can be implemented with a plurality of PMOS transistors each enabled by an active logic low signal with all other signals held at logic high, as illustrated in Table 1. Alternately, NMOS transistors or full CMOS pass gates could be utilized to implement the de-multiplexor 404.

All six DCDL delay stages are enabled when the counter output is set to six, and CKE is directed through de-multiplexor output 426 through multiplexors 420, 418, 416, 414, 412, 410, 408 and delay elements labeled 9-4. The DCDL line is frozen when the counter 308 is disabled by the SW signal set to logic low.

Figure 1:
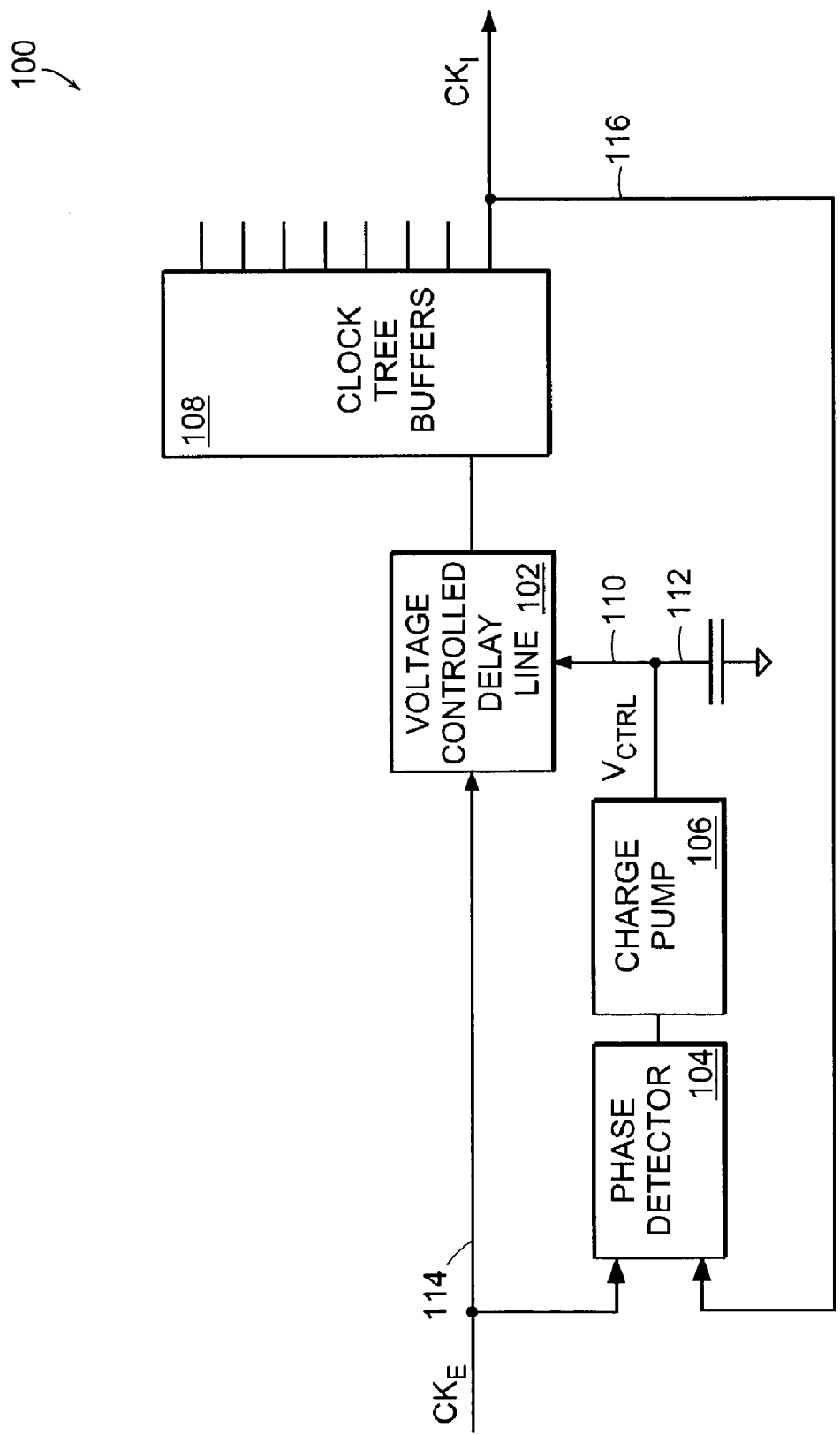
FIG. 1 is a block diagram of a prior art analog delay locked loop (DLL)
Figure 2:
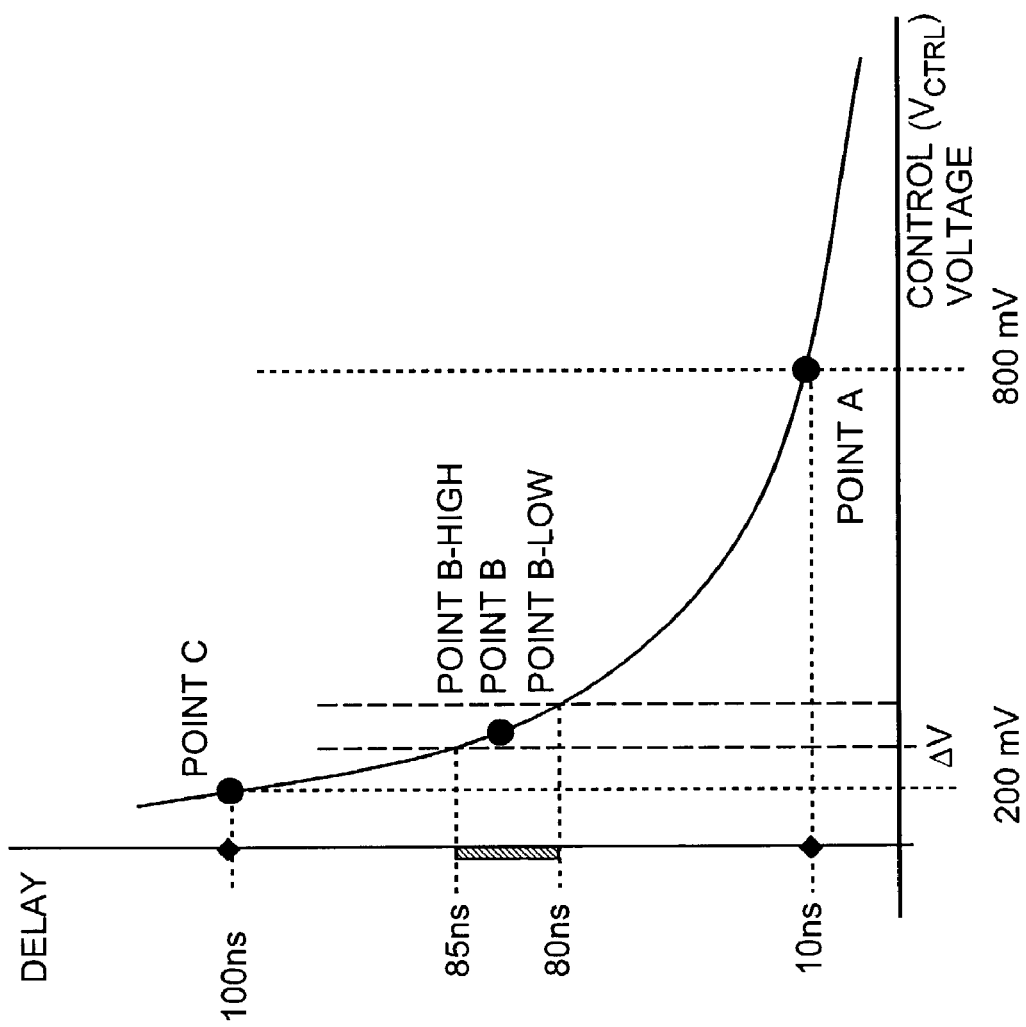
FIG. 2 is a graph illustrating the non-linear controlling voltage characteristic for the voltage controlled delay line shown in FIG. 1.
Figure 6:
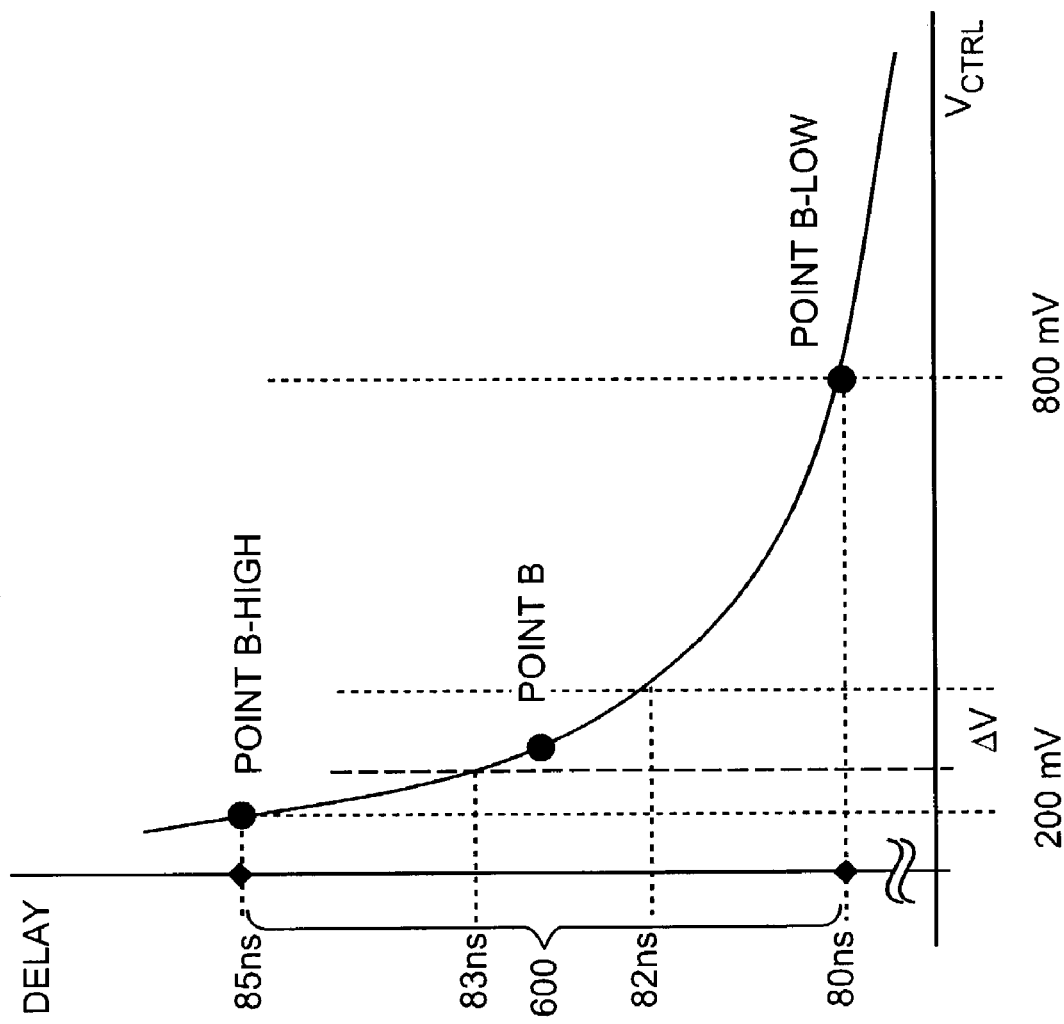
FIG. 6 is a graph illustrating the non-linear controlling voltage characteristic for the narrow frequency range of the VCDL in the DLL shown in FIG. 3.

FIG. 6 is a graph illustrating the non-linear control voltage characteristic for the narrow delay range of the VCDL 312 in the DLL 300 shown in FIG. 3. In the embodiment shown, the digital domain provides the minimum delay to bring the operating range of the DLL 300 to point B. After lock condition has been attained, the analog domain operates within a narrow delay range 600 from point B-High to point B-Low. This delay range is much smaller than the wide delay range supported by the DLL, but may be controlled by the same large voltage range as applied in the pure analog case of FIG. 2. The small delay range controlled by a large voltage range ensures the stability of the analog domain during normal operation of the DLL.

As shown, the analog delay circuit 304 operates within the delay range 85 ns to 80 ns over voltage range 200 mV to 800 mV to provide fine phase adjustment for the delay locked loop. In contrast to the wide delay range over the same voltage range shown in FIG. 2, a small variation in control voltage (ΔV) does not substantially affect the delay.

Figure 7:
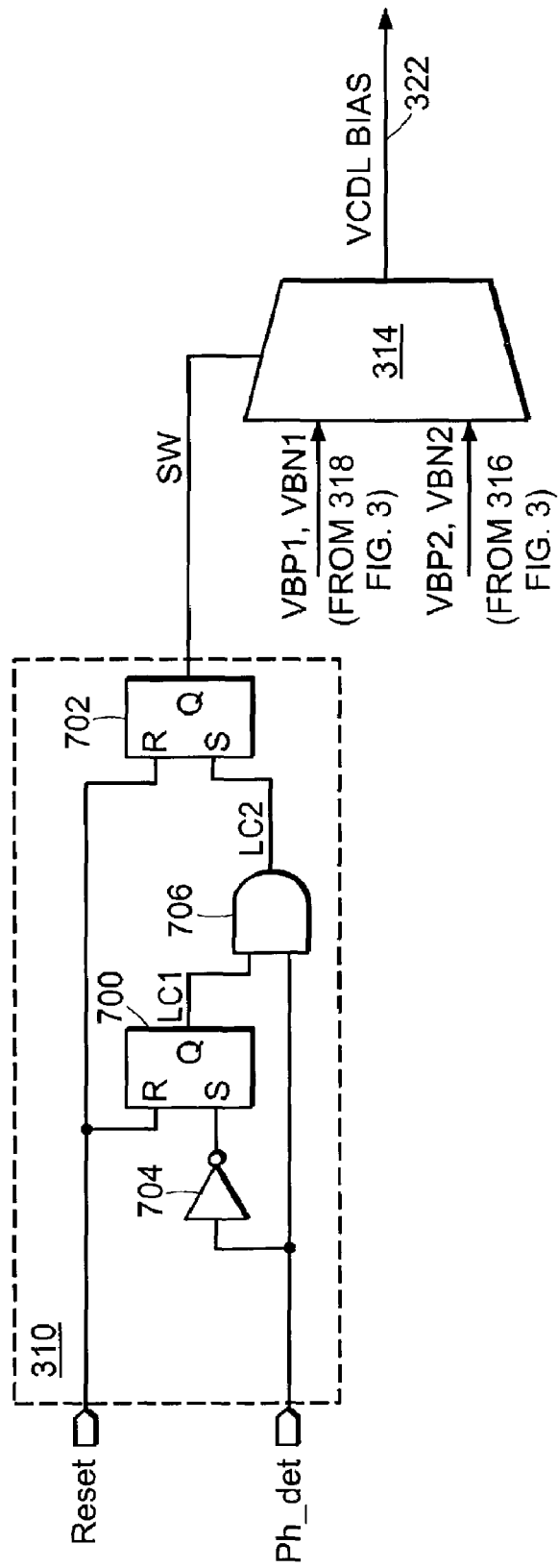
FIG. 7 is a schematic of an embodiment of the lock detector and the analog switch shown in FIG. 3.

FIG. 7 is a schematic of an embodiment of the lock detector 310 and the multiplexor 314 shown in FIG. 3. The lock detector 310 includes two SR flip-flops 700, 702, AND gate 706 and inverter 704. SR flip-flop 700 detects when the internal clock signal CKI is within a phase detection window. SR flip-flop 702 detects when the internal clock signal CKI is in phase with the external clock signal CKE. Once the internal clock signal CKI is in phase with the external clock signal CKE the SW signal is set to logic '0' to disable further changes to the DCDL delay.

The lock detector output SW is held at logic '0' prior to lock being reached and set to logic '1' after lock is reached. Prior to lock being reached, the logic '0' on the SW signal couples the fixed bias voltage through multiplexor 314 to provide the VCDL bias voltage pair 322. After lock has been reached, the logic '1' on SW couples the variable bias voltage pair VBPN2, VBPN2 through multiplexor 314 to provide the VCDL bias voltage pair 322, to allow the VCDL 312 to fine tune the overall delay.

During power up of the device, the reset signal coupled to the R-input of the SR flip-flop 700 and the SR flip-flop 702 is set to logic '1'. Both flip-flops 700, 702 are reset with the respective Q outputs (LC1, SW) set to logic '0'. The SR flip-flops 700, 702 remain in a reset state with logic '0' on the respective Q outputs until the phase detector 320 detects that the phase difference between clock signals CKE, CKI are in the phase detection window. The phase difference is within the phase detection window while the rising edge of the internal clock signal CKI occurs after the falling edge of the external clock signal CKE. The output of the phase detector (Ph_det) changes to logic '0'. The logic '0' on Ph_det changes the S-input of SR flip flop 700 to logic '1' through inverter 704 which sets SR flip-flop 700 (i.e. the Q output changes to logic '1'). The delay provided by the DCDL 306 continues to increase further delaying the rising edge of the internal clock signal until the internal clock signal and the external clock signals are in phase. SR flip-flop 702 is set on the next rising edge of Ph-det which occurs when the rising edge of CKE is detected after the rising edge of CKI. The Q output of SR flip-flop 702 is set to logic '1' indicating that coarse phase adjustment is provided by the digital delay circuit. The logic '1' on the output of SR flip-flop 702, the SW signal, disconnects the VCDL bias signal 322 from bias voltage pair VBP1, VBN1 through multiplexor 314 and connects the bias voltage pair VBP2, VBN2 from charge pump 316 (FIG. 3) to the VCDL bias voltage pair 322 to the VCDL 312.

The lock detector 310 remains in a locked state with SW set to logic '1' until the system is reset. While in the locked state, the digital domain no longer controls the delay because, while SW is set to logic '1', the code stored in the counter 308 is frozen to freeze the DCDL delay.

Figure 8:
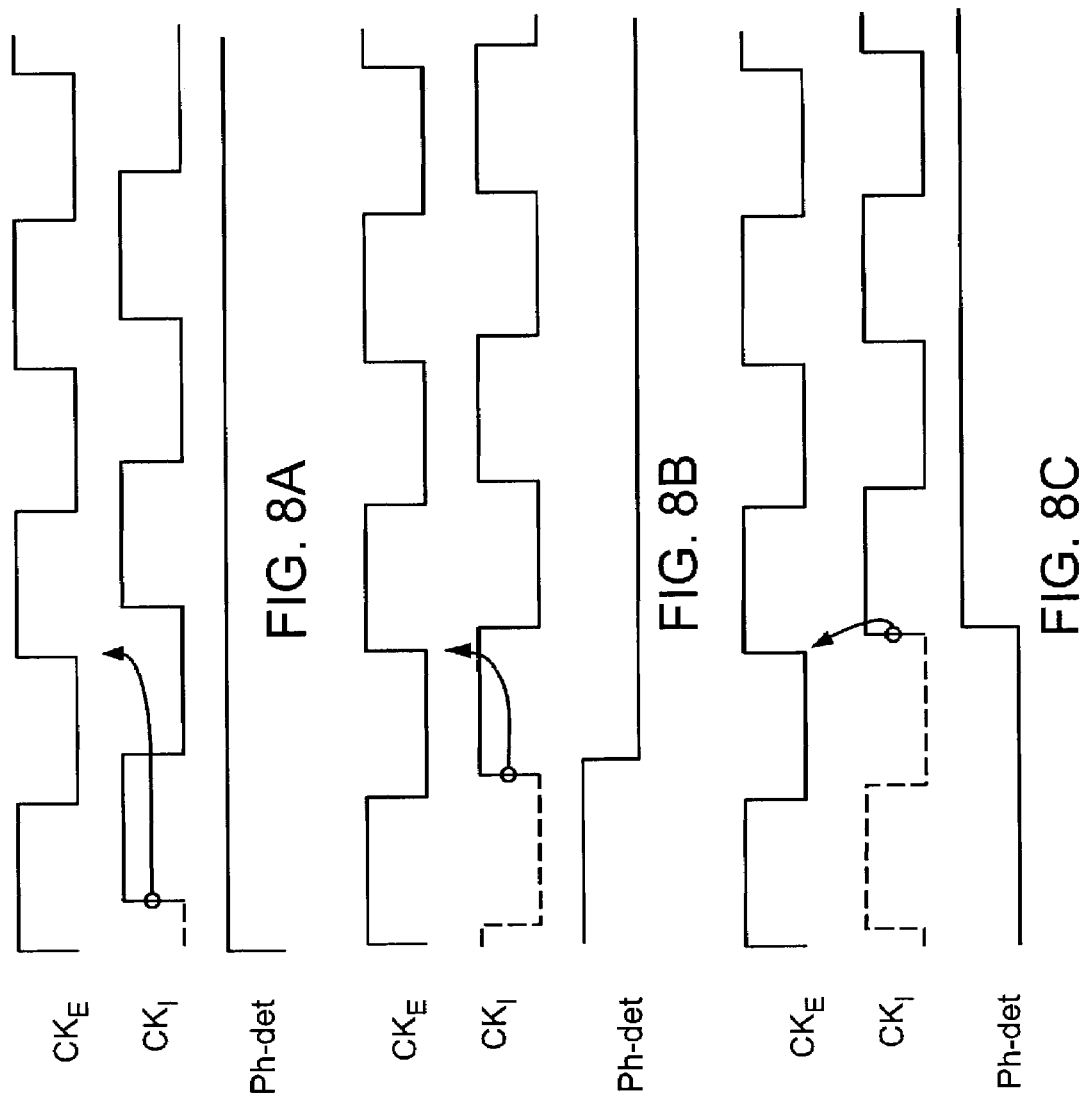
FIGS. 8A-C are timing diagrams illustrating the relationship of the phase detector output to the phase difference between the clocks.

FIGS. 8A-C are timing diagrams illustrating the relationship of the phase detector output (Ph-det) to the phase difference between the clocks. Referring to FIG. 8A, at initialization, the phase detector 320 (FIG. 3) detects that the internal clock rising edge occurs after the external clock rising edge. The rising edge of CKI latches a '1' on the Ph_det output of the D-type flip-flop. The CKE rising edge continues to increment the code to add additional delay to the DCDL.

Referring to FIG. 8B, the phase detector detects that the CKI rising edge is now after the falling edge of CKE, i.e. the internal clock rising edge is within a phase detection window. The rising edge of CKI latches a '0' on the Ph_det output of the D-type flip-flop. The CKE rising edge increments the code to add further delay elements 400 to the DCDL.

Referring to FIG. 8C, the phase detector detects the lock condition when the CKI rising edge moves after the CKE rising edge. The rising edge of CKI latches a '1' on the Ph_det output of the D-type flip-flop.

Figure 9:
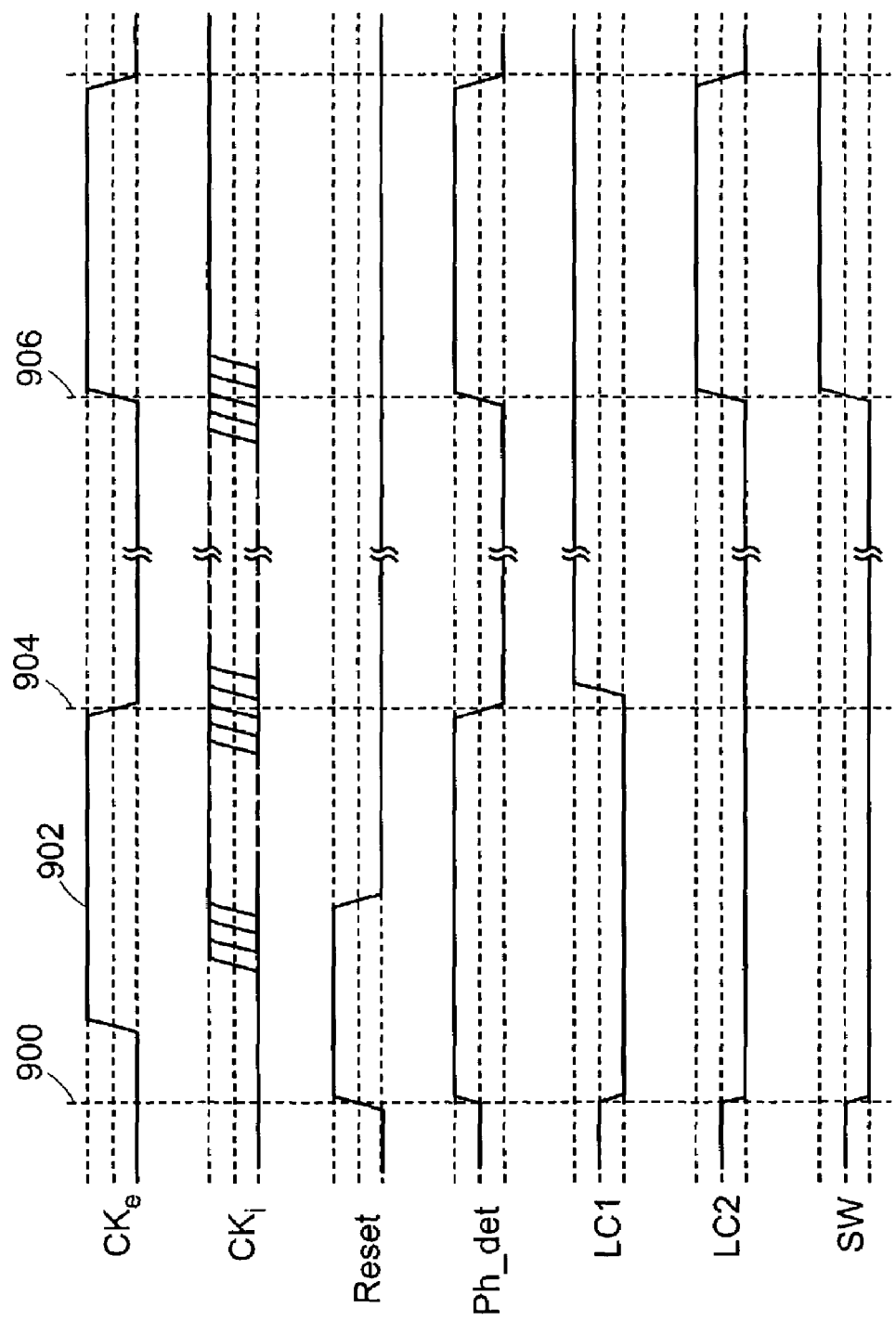
FIG. 9 is a timing diagram illustrating signals in the schematic shown in FIG. 7.

FIG. 9 is a timing diagram illustrating signals in the schematic shown in FIG. 7. The timing diagram shows the state of signals in the schematic when the system is reset, upon detecting that the phase detection window has been reached and upon detecting the lock condition (when the clock edges of CKE and CKI are aligned). FIG. 9 is described in conjunction with FIG. 3 and FIG. 7.

At time 900, the system is reset and the reset signal switches to logic '1'. The reset signal is coupled to the R-inputs of flip-flops 700, 702 to reset the flip-flops. The Ph_det signal is reset to logic '1'. The Q outputs (LC1, SW) of both flip-flops are reset to '0'. The internal clock signal CKI has the same frequency as the external clock signal CKE but there is an initial phase difference due to the delay of CKE through the clock tree buffers 328.

At time 902, after the system is reset, the reset signal changes to logic '0'. Initially delay is added to CKE through the DCDL and no delay is added through the VCDL. The rising edge of CKI occurs later than the rising edge of CKE due to the delay through the clock tree buffers 328 (FIG. 3) and the delay through the DCDL. The SW signal set to logic '0' allows CKE to increment the code stored in the counter 308 (FIG. 3). As the code stored in the counter 308 (FIG. 3) is incremented by CKE (rising edge or falling edge), more delay elements 400 (FIG. 4) are added to the DCDL 306 (FIG. 3) to further delay CKE. The delay between CKE and CKI increases until the phase detection window is reached.

At time 904, the phase detector 320 (FIG. 3) detects that the phase detection window has been entered. The Ph_det signal output from the phase detector changes state from logic '1' to logic '0' indicating that the phase detector 320 has detected a rising edge of CKI signal after a falling edge of CKE. SR flip-flop 600 is set, and LC1 at the Q output is set to '1'. In successive clock periods, the phase difference between CKE and CKI decreases as the DCDL delay is increased.

At time 906, the phase detector 320 (FIG. 3) detects that the sufficient delay has been added by the DCDL such that the rising edge of CKI occurs after the rising edge of CKE. The Ph-det output of the phase detector 320 changes to back to logic '1'. LC2 at the output of AND gate 706 changes to logic '1', the SR flip-flop 702 is set and the Q output (SW) changes to logic '1'. Further changes on the Ph-det signal do not affect the state of LC1 and SW. The SW signal set to '1' disables further incrementing of the counter 308.

During normal DLL operation, the delay adjustment of the clock path to compensate for drifts and condition changes covers a narrow range of the wide delay range. Thus, after the lock has been reached, the DCDL enables delay elements to provide coarse phase adjustment in the delay locked loop. The DLL delay is varied by the VCDL inside a smaller delay range to provide fine phase adjustment in the delay locked loop. Monitoring the smaller delay range during normal operation provides more stability and reduces the controlling voltage node sensitivity. In case that the DLL loses the lock condition beyond the capability of the VCDL to compensate, the system resets to initial conditions and the DCDL is reactivated to bring the external and internal clocks within the phase detection window range.

The invention has been described for an embodiment having a single fixed bias voltage level. In an alternate embodiment, more than one fixed bias voltage level, or more than one fixed bias voltage pair levels, can be used to provide a more compact DLL that is less noise sensitive. This allows the wide delay range to be modified in order to reduce the number of DCDL delay elements by selecting a fixed bias voltage level dependent on the frequency of the external clock. Reducing the number of DCDL delay elements, reduces sensitivity to noise. For example, in one embodiment, with a fixed bias voltage of 0.6VDD, fifteen DCDL delay elements are required to provide the DCDL delay. When the fixed bias voltage is 0.7VDD, only eight DCDL delay elements are required to provide the DCDL delay. However, changing the delay range may result in the delay range covering an unstable region, for example, at point C in the graph shown in FIG. 2.

The invention can be used in integrated circuits requiring high accuracy of input/output data synchronization, for example, in memory, microprocessor and Application Specific Integrated Circuits (ASICs).

While this invention has been particularly shown and described with references to preferred embodiments thereof, it will be understood by those skilled in the art that various changes in form and details may be made therein without departing from the scope of the invention encompassed by the appended claims. For example, while the delay of the DCDL remains fixed over short times, it may be allowed to occasionally shift as, for example, the VCDL approaches its delay limits.

What is claimed is:

1. A delay locked loop comprising:
    a digitally controlled delay line circuit which selectively enables delay elements to provide coarse phase adjustment in the delay locked loop;
    an analog delay line circuit which provides a fine phase adjustment in the delay locked loop in response to a control signal;
    a phase comparator configured to compare an input clock signal and an output clock signal;
    a first detection circuit providing a first condition signal in response to an output clock signal rising edge occurring after a rising edge of the input clock signal;
    a second detection circuit providing a second condition signal in response to the output clock signal rising edge occurring after a falling edge of the input clock signal; and
    a lock detector circuit configured to hold the digitally controlled delay line circuit at a fixed delay in response to the lock detector circuit detecting that the first and second condition signals are present while the analog delay line circuit provides for fine phase adjustment.

2. The delay locked loop of claim 1 wherein the digitally controlled delay line circuit operates over a wide delay range.

3. The delay locked loop of claim 2 wherein the analog delay line circuit operates over a small delay range within the wide delay range.

4. The delay locked loop of claim 1 wherein the analog delay line circuit is held at a second fixed delay until the digitally controlled delay line circuit completes the coarse phase adjustment.

5. The delay locked loop of claim 1 wherein the digitally controlled delay line circuit includes a plurality of fixed delay elements.

6. A method for performing phase adjustment in a delay locked loop comprising the steps of:
    enabling delay elements in a digital delay circuit to provide coarse phase adjustment in the delay locked loop;
    detecting a first condition in response to an output clock signal rising edge occurring after a rising edge of an input clock signal;
    providing a first signal in response to the first condition;
    detecting a second condition in response to the output clock signal rising edge occurring after a falling edge of the input clock signal;
    providing a second signal in response to the second condition;

providing the fine phase adjustment with the analog delay circuit while any digital delay adjustment is precluded; and holding the digital delay circuit at the fixed delay in response to detecting that the first and second signals are present.

7. The method of claim 6 further comprising the steps of:
detecting completion of the coarse phase adjustment;
freezing the fixed delay upon completion; and
enabling fine phase adjustment.

8. The method of claim 6 wherein the digital delay circuit operates in a wide delay range.

9. The method of claim 8 wherein the analog delay circuit operates in a small delay range within the wide delay range.

10. The method of claim 6 further comprising the step of: holding the analog
delay circuit at a second fixed delay until the digital delay circuit completes the coarse phase adjustment.

11. The delay locked loop of claim 6 wherein the digital delay circuit includes a plurality of fixed delay elements.

12. A delay locked loop comprising:
digital delay means for selectively enabling delay elements to provide coarse phase adjustment in the delay locked loop;
analog delay means for providing a fine phase adjustment in the delay locked loop;
phase comparing means for comparing an input clock signal and an output clock signal;
means for detecting a first condition in response to an output clock signal rising edge occurring after a rising edge of the input clock signal, and providing a first signal in response to the detection of the first condition;
means for detecting a second condition in response to the output clock signal rising edge occurring after a falling edge of the input clock signal, and providing a second signal in response to the detection of the second condition; and
lock detection means for holding the digital delay means at a fixed delay in response to the lock detection means detecting that the first and second signals are present while the analog delay means provides the fine phase adjustment.

13. The delay locked loop of claim 12 wherein the digital delay means operate in a wide delay range.

14. The delay locked loop of claim 13 wherein the analog delay means operate in a small delay range within the wide delay range.

15. The delay locked loop of claim 12 wherein the analog delay means is held at a second fixed delay until the digital delay means completes the coarse phase adjustment.

16. The delay locked loop of claim 12 wherein the digital delay circuit includes a plurality of fixed delay elements.

17. A delay locked loop comprising:
a digitally controlled delay line which provides coarse delay adjustment until a locked condition has been attained by the delay locked loop;
an analog delay line circuit which provides fine delay adjustment to maintain the delay locked loop substantially in the locked condition in response to a control signal;
a phase comparator configured to compare an input clock signal and an output clock signal;
a first detection circuit providing a first condition signal in response to an output clock signal rising edge occurring after a rising edge of the input clock signal;
a second detection circuit providing a second condition signal in response to the output clock signal rising edge occurring after a falling edge of the input clock signal; and
a lock detector circuit holding the digitally controlled delay line circuit at a fixed delay in response to the lock detector circuit detecting that the first and second condition signals are present while the analog delay line circuit provides for fine phase adjustment.

\* \* \* \* \*